(12) United States Patent
Shibata et al.

(10) Patent No.: US 7,227,159 B2
(45) Date of Patent: Jun. 5, 2007

(54) ION IMPLANTATION APPARATUS AND ION IMPLANTING METHOD

(75) Inventors: Takeshi Shibata, Yokohama (JP); Hiroshi Hashimoto, Moriguchi (JP); Tadahiko Hirakawa, Nishisonogi-gun (JP); Kazuhiko Tonari, Susono (JP)

(73) Assignees: Kabushiki Kaisha Toshiba, Tokyo (JP); ULVAC, Inc., Kanagawa (JP); Sanyo Electric Co., Ltd., Osaka (JP); Sony Corporation, Tokyo (JP)

( * ) Notice: Subject to any disclaimer, the term of this patent is extended or adjusted under 35 U.S.C. 154(b) by 112 days.

(21) Appl. No.: 10/950,633

(22) Filed: Sep. 28, 2004

(65) Prior Publication Data

US 2005/0211924 A1   Sep. 29, 2005

(30) Foreign Application Priority Data

Mar. 29, 2004   (JP)   .............................. 2004-097065

(51) Int. Cl.
  *H01J 37/317*   (2006.01)
(52) U.S. Cl. .................................. 250/492.21; 250/397
(58) Field of Classification Search ............ 250/492.21
  See application file for complete search history.

(56) References Cited

U.S. PATENT DOCUMENTS

| | | | | |
|---|---|---|---|---|
| 5,350,926 A | * | 9/1994 | White et al. | 250/492.21 |
| 6,255,662 B1 | * | 7/2001 | Rubin et al. | 250/492.21 |
| 6,881,967 B1 | * | 4/2005 | Ray | 250/492.21 |
| 7,105,839 B2 | * | 9/2006 | White | 250/492.21 |

FOREIGN PATENT DOCUMENTS

| | | |
|---|---|---|
| JP | 02-005346 | 1/1990 |
| JP | 6-325723 | 11/1994 |
| JP | 07-172990 | 7/1995 |
| JP | 08-055815 | 2/1996 |
| JP | 09-245722 | 9/1997 |
| JP | 10-040855 | 2/1998 |
| JP | 10-064470 | 3/1998 |
| JP | 11-507762 | 7/1999 |
| JP | 2000-150407 | 5/2000 |

OTHER PUBLICATIONS

Copy of Notification of Reasons for Rejection from Japanese Patent Office mailed Feb. 6, 2007, in Japanese Application No. 2004-097065.

* cited by examiner

*Primary Examiner*—David Vanore
*Assistant Examiner*—Phillip A. Johnston
(74) *Attorney, Agent, or Firm*—Finnegan, Henderson, Farabow, Garrett & Dunner, L.L.P.

(57) ABSTRACT

An ion implantation apparatus includes an ion irradiation unit. The ion irradiation unit irradiates a plurality of areas of a target substrate with ion beams each of which reaches the substrate at corresponding one incident angle. An incident angle measuring instrument measures the incident angle of each of the ion beams. A controller is provided with information from the incident angle measuring instrument and controls the ion irradiation unit in accordance with the information so that a difference among incident angles is set to within ±0.1°.

14 Claims, 12 Drawing Sheets

ION IMPLANTATION APPARATUS AND ION IMPLANTING METHOD

CROSS-REFERENCE TO RELATED APPLICATIONS

This application is based upon and claims the benefit of priority from prior Japanese Patent Application No. 2004-097065, filed Mar. 29, 2004, the entire contents of which are incorporated herein by reference.

BACKGROUND OF THE INVENTION

1. Field of the Invention

The present invention relates to an ion implantation apparatus and ion implanting method.

2. Description of the Related Art

In many cases, a plurality of semiconductor devices is formed at a time on a single semiconductor substrate (wafer). At this point, in order to improve the manufacturing yield, it is required to suppress variations in electrical characteristics among the semiconductor devices. One main factor determining the electrical characteristics is the doping profile and dose of impurities implanted into the semiconductor substrate. That is, it is required to make the semiconductor devices uniform in the doping profile including the position of the highest impurity concentration and the dose. Likewise, it is important to make semiconductor devices formed on difference semiconductor substrates uniform in electrical characteristics.

BRIEF SUMMARY OF THE INVENTION

According to a first aspect of the present invention, there is provided an ion implantation apparatus comprising: an ion irradiation unit irradiating a plurality of areas of a target substrate with ion beams, each of the ion beams reaching the substrate at corresponding one incident angle; an incident angle measuring instrument measuring the incident angle of each of the ion beams; and a controller provided with information from the incident angle measuring instrument and controlling the ion irradiation unit in accordance with the information so that a difference among incident angles is set to within ±0.1°.

According to a second aspect of the present invention, there is provided an ion implantation method comprising: irradiating a plurality of areas of a target substrate with ion beams, each of the ion beams reaching the substrate at corresponding one incident angle; measuring the incident angle of each of the ion beams; and changing a path of each of the ion beams so that a difference among the incident angles is set to within ±0.1°.

DETAILED DESCRIPTION OF THE INVENTION

In the process of development of the invention, the inventors studied control of variations in electrical characteristics among semiconductor devices by controlling variations in impurity profile and dose (hereinafter referred simply to as impurity profile). As the result, the inventors obtained the following knowledge:

The ion implantation carried out by introducing impurities is affected by a phenomenon called channeling. Channeling is a phenomenon in which, when the direction in which an ion beam impinges at the semiconductor substrate coincides with the crystal orientation of the semiconductor substrate, many impurities reach deeper than the position of a peak value of the impurity profile obtained when the ion implantation direction does not coincide with the crystal orientation. The amount of channeling depends on an incident angle at which ions are implanted into the semiconductor substrate (perpendicularity). Variations in the angle of implantation result in variations in the impurity profile. In order to make the impurity profile uniform among semiconductor devices, therefore, it is important to make the incident angle of ion implantation among the semiconductor devices.

At present, variation in incident angle of ion implantation among positions on a single semiconductor substrate (parallelism) are on the order of ±0.3 to ±0.5°. The reasons are: the area of the semiconductor substrate is large and thus the area where ions are to be implanted is large; and it is very difficult to electrically scan an ion beam to achieve an equal angle of ion implantation at each position on the semiconductor substrate. For this reason, no attempt has been made to control variations in characteristics among semiconductor devices by controlling the parallelism and the amount of channeling.

Other methods to reduce variations in characteristics among semiconductor devices attributed to variations in amount of channeling not by controlling the amount of channeling were studied. As one of them, an approach was found effective which, in implanting light ions, which are liable to cause the channeling, into a semiconductor substrate at a high energy, tilts the path of the ion beam through a given angle of, say, 7 degrees relative to the semiconductor substrate. Through the use of this approach, the occurrence of variations in electrical characteristics among semiconductor devices attributed to the channeling amount variations has been prevented.

However, there are also problems with this approach. In general, a mask material having openings in an area where ions are to be implanted is formed over a semiconductor substrate using the lithography technology and ions are then implanted through the openings. Since the mask material has a thickness, when ions are implanted into the semiconductor substrate at an angle, the impurity distribution becomes nonuniform in the direction of the surface of the semiconductor substrate. That is, the ion beam cannot reach some portion of an area where ions require to be implanted, even if the area is immediately under the opening (shadowing). Thus, an impurity distribution in plane is not similar in shape to the opening.

To solve such a problem, a method has been devised which involves rotating a semiconductor substrate in units of 90 or 180 degrees in plane and implanting ions into the substrate with each rotation. In this case as well, however, the nonuniformity of the impurity distribution in plane can be reduced in some degree, but it is not eliminated. In addition, the number of processing steps increases.

To lessen the effect of channeling, another method is known which involves implanting ions into a target substrate through an insulating film formed on it. However, this method also has the problem that the number of processing steps increases. In addition, variations in quality or thickness of the insulating film result in failure to control the impurity distribution well.

As described above, the methods for suppressing variations in characteristics among semiconductor devices attributed to variations in amount of channeling are not sufficient to prevent the shadowing from occurring and the number of processing steps from increasing.

The preferred embodiments of the present invention configured based on such knowledge as described above will be described hereinafter with reference to the accompanying drawings. In the following description, constituent elements which have substantially the same functions and arrangements are denoted by like reference numerals and repeated descriptions thereof will be given only when necessary.

First Embodiment

As described above, controlling the amount of channeling has not been performed heretofore in order to suppress variations in characteristics among semiconductor devices. A reason is that difficulties have been involved so far in controlling the angle of implantation and variations in an incident angle with high accuracy. However, recent advances in technology have allowed the angle of implantation and variations in angle of implantation to be controlled with high accuracy.

Figure 1:
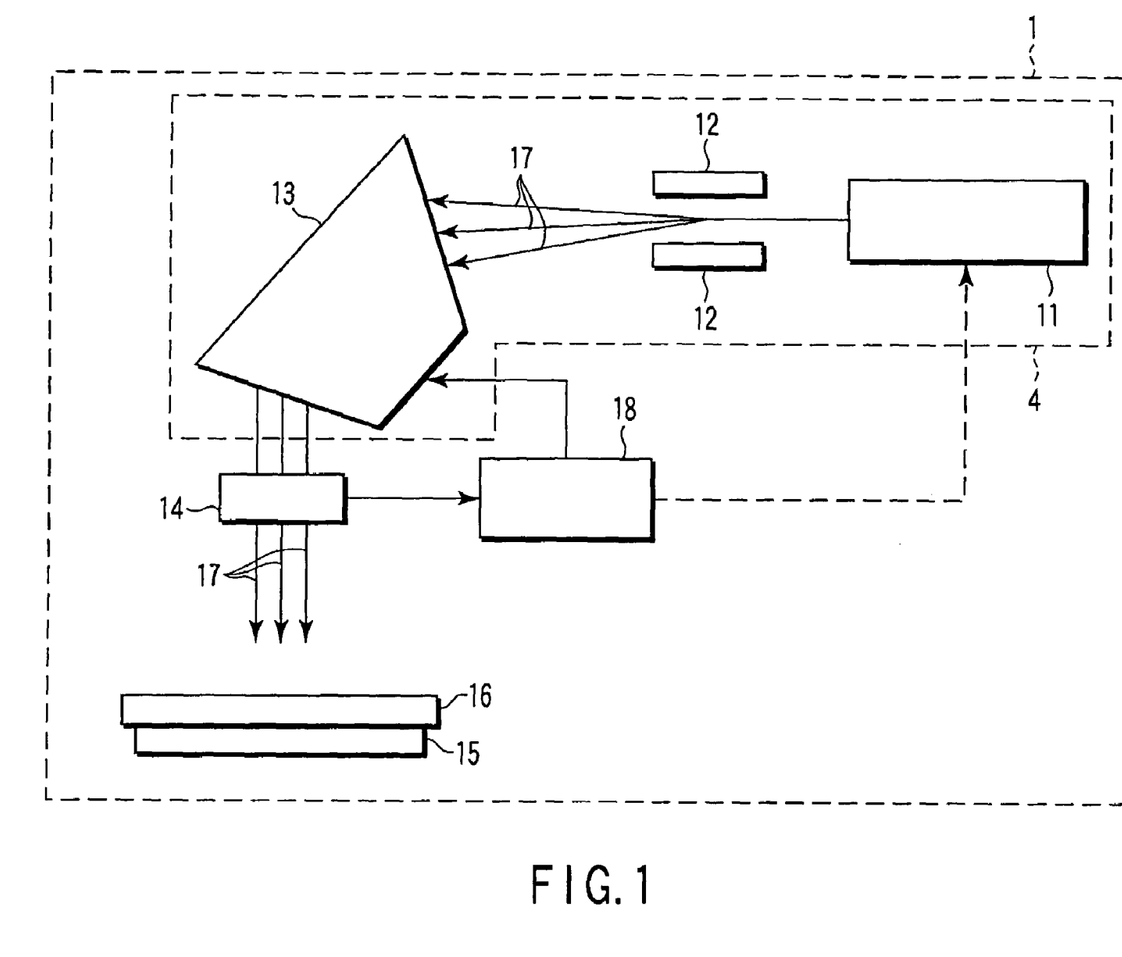
FIG. 1 is a schematic representation of the main portion of an ion implantation apparatus according to a first embodiment of the present invention.

First, a description is given of an ion implantation apparatus and method which allows an incident angle and variations in the incident angle to be controlled with high accuracy. FIG. 1 schematically illustrates the main portion of an ion implantation apparatus, indicated generally at 1, according to a first embodiment of the present invention. As shown in FIG. 1, the ion implantation apparatus 1 is equipped with an ion irradiation unit 4, an incident angle measuring instrument 14, a substrate holder 15, and a controller 18. A target substrate 16 is placed on the substrate holder 15.

The ion irradiation unit 4 irradiates the target substrate 16 with expanded ion beams whose angle of implantation relative to the substrate is set at a given value. That is, the ion beam irradiation unit 4 is adapted to produce ion beams 17 in one direction, then expand the ion beams, collimate the paths of the expanded ion beams, and change the paths of the collimated ion beams toward the target substrate 16. The ion irradiation unit 4 includes an ion beam generating unit 11, an electrostatic scanner 12, and a collimator magnet 13.

Though not shown, the ion beam generating unit 11 includes an ion source, an analyzer magnet, and an accelerating tube. The analyzer magnet selectively takes target ions out of ions generated by the ion source. The accelerating tube accelerates the target ions up to a desired energy level.

The ion beam 17 emitted from the ion beam generating unit 11 enters the electrostatic scanner 12. The electrostatic scanner 12 scans the ion beam 17 to expand it. The collimator magnet 13 directs the expanded ion beam 17 toward the target substrate (semiconductor substrate) 16 and collimate it.

The ion beams 17 from the collimator magnet 13 pass through the incident angle measuring instrument 14. The incident angle measuring instrument 14 measures the incident angles of the ion beams 17 relative to the target substrate 16 and variations in the incident angle. The ion beams 17 pass through the incident angle measuring instrument 14 then arrive at the target substrate 16. The substrate holder 15 is holds the target substrate 16 during the ion implantation process. The substrate holder 15 is formed from, for example, a platen having an electrostatic chuck. The controller 18 is supplied with measured data from the incident angle measuring instrument 14 to control the collimator magnet 13 so that each of the ion beams 17 have a desired path. That is, by changing the magnet current in the collimator magnet 13 and thereby adjusting the magnet-field strength, the paths of the ion beams 17 are fine adjusted. The description on the broken arrow from the controller 18 will be given later.

Figure 2:
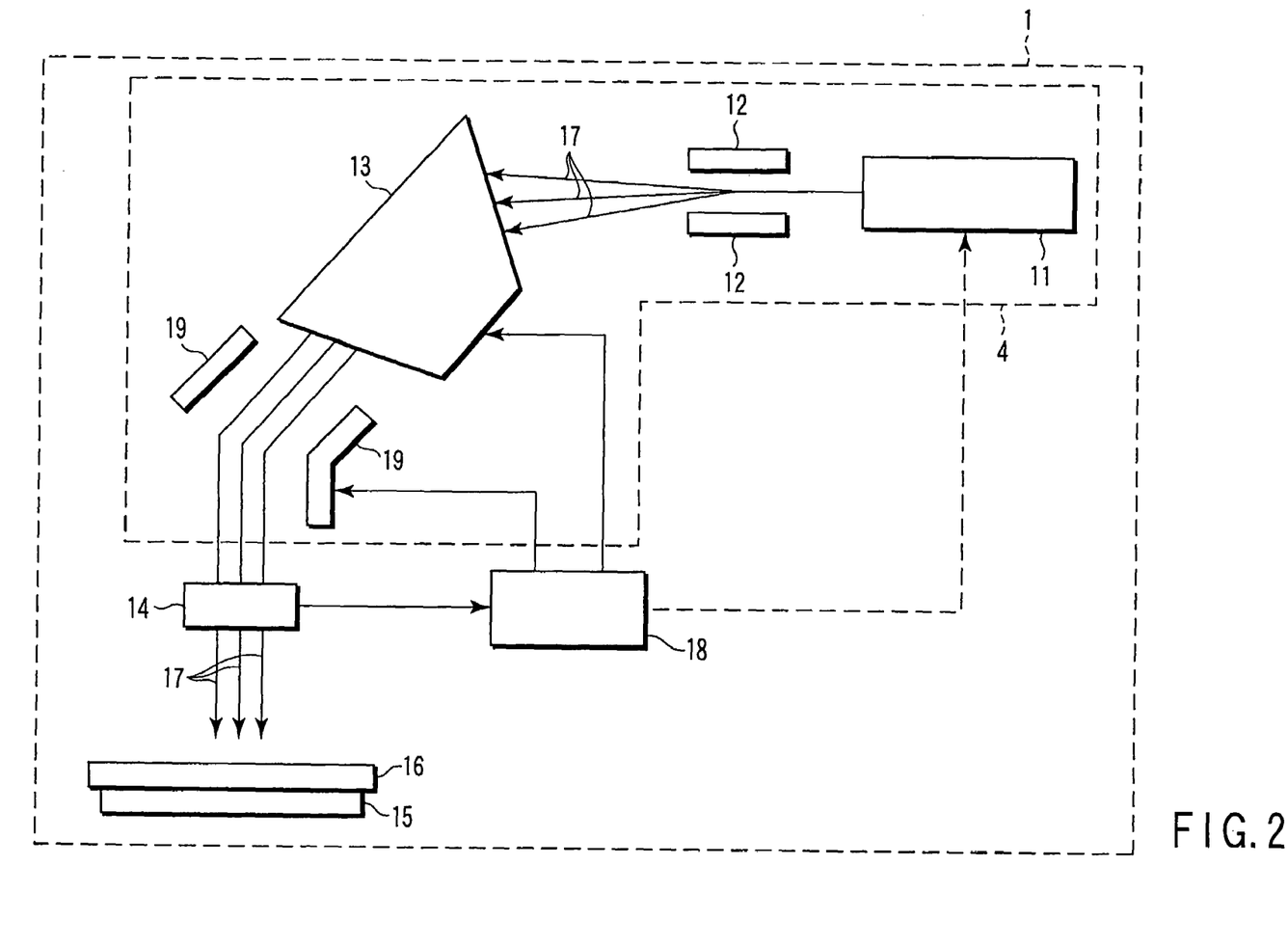
FIG. 2 is a schematic representation of another example of the main portion of the ion implantation apparatus of the first embodiment.

The ion irradiation unit 4 may be configured so that a deflector 19 is added to the arrangement of FIG. 1 as shown in FIG. 2. The deflector 19 produces a proper electric field to direct the paths of ions toward the target substrate 16. The ion beams whose paths have been changed by the deflector 19 pass through the incident angle measuring instrument 14. The controller 18 responds to data from the incident angle measuring unit 14 to control the magnetic field of the collimator magnet 13 and the electric field of the deflector 19 so that each of the ion beams 17 have a desired path.

Figure 3:
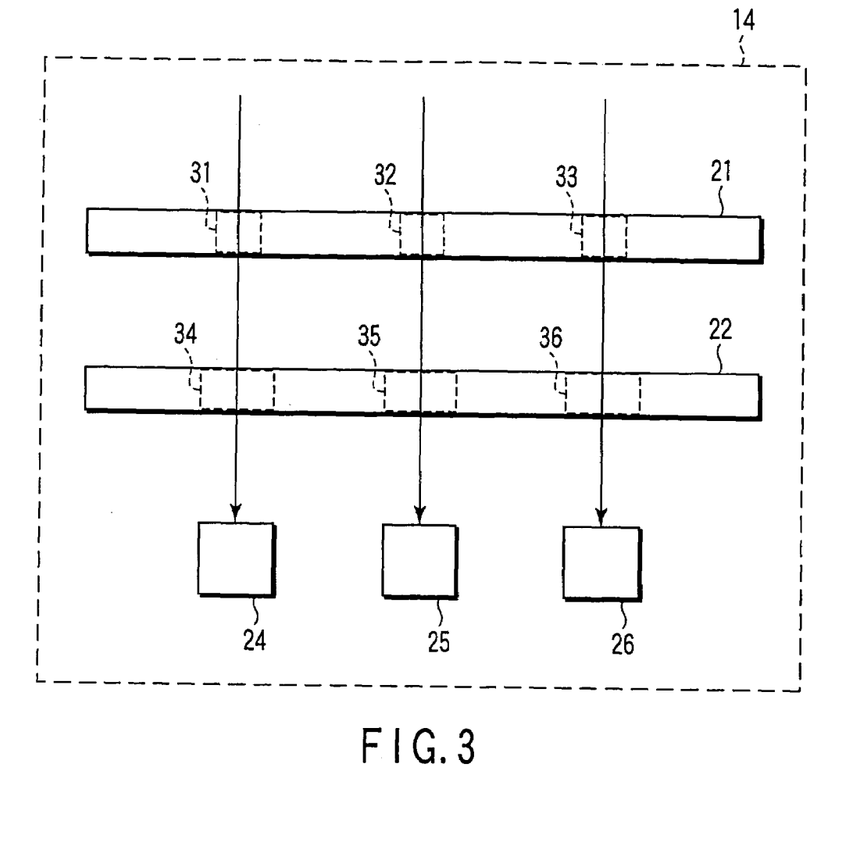
FIG. 3 is a schematic representation of the main portion of the angle measuring instrument.

FIG. 3 is a schematic illustration of the main portion of the incident angle measuring instrument 14. As shown in FIG. 3, the incident angle measuring instrument 14 has a first plate 21, a second plate 22, and three charge measuring instruments 24, 25 and 26 adapted to measure the charge of the ion beams. Each of the charge measuring instruments 24 to 26 may consist of a faraday cup. The first plate 21 and the second plate 22 are placed substantially parallel to each other with spacing therebetween. The charge measuring instruments 24 to 26 are arranged at a predetermined distance apart from one another in parallel to the first plate 21 and the second plate 22.

Figure 4:
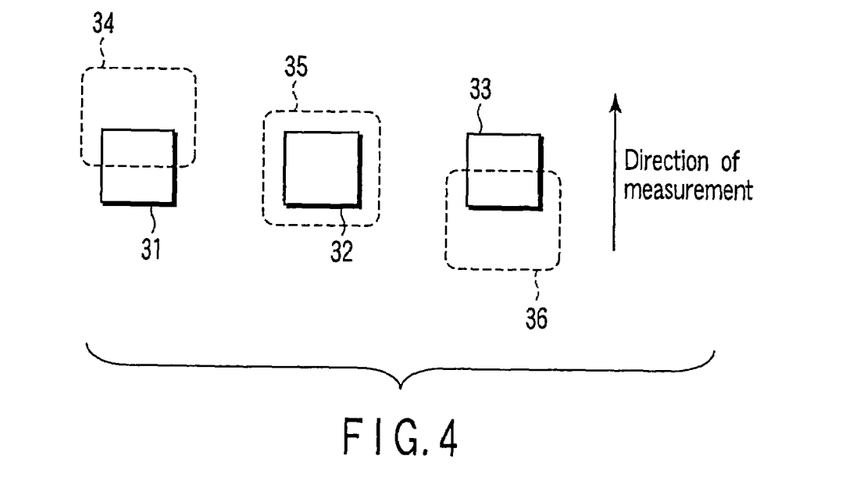
FIG. 4 shows the shapes of the openings in the angle measuring instrument and their positional relationship.

The first plate 21 has openings 31, 32 and 33, which are formed at a predetermined distance apart from one another. The second plate 22 also has openings 34, 35 and 36, which are formed at a predetermined distance apart from one another. FIG. 4 shows the size and relative position relationship of the openings 31 to 36 in a plane parallel to the first plate 21 and the second plate 22. The openings 34, 35 and 36 are larger in area than the openings 31, 32 and 33, respectively. The openings 32 and 35 are centered at the same position and the opening 32 as a whole is positioned within the opening 35. The opening 31 overlaps with the opening 34 only in its upper half portion. The opening 33 overlaps with the opening 36 only in its lower half portion.

The direction in which the ion beam 17 travels along corresponds with the direction penetrating the paper of FIG. 4 from the reader side of the paper to the backside thereof. The incident angle measuring instrument 14 measures the incident angle of the ion beam 17 which changes in the down to up direction in the paper of FIG. 4 (shown by the arrow in FIG. 4).

The measuring instruments 24, 25 and 26 respectively measure the amounts of charge (the numbers of ions) I1, I2 and I3 of ion beams 17. The amounts of charge I1, I2 and I3 depend on the incident angle of the ion beams 17 to the incident angle measuring instrument 14. Therefore, the ratio of the amounts of charge I1, I2 and I3 allows the incident angles of the ion beams 17 to the measuring instrument 14 to be measured. The measured incident angle of the ion beams 17 coincides with the angle at which the ion beams 17 impinge at the substrate 16. For example, when the incident angles of the ion beams are 90 degrees, $2\times I1=I2=2\times I3$. When the incident angles slightly deviate from 90 degrees, I2 remains unchanged, but one of I1 and I3 increases and the other decreases by an equal amount. The incident angles of ion beams 17 are calculated from the percentage of this increase (decrease).

An electrostatic chuck whose surface flatness is as high as 1 μm can be used for the substrate holder 15. With such an electrostatic chuck, the fluctuation of the angle at which the target substrate 16 is held during stage movement can decrease to 7 seconds (7/3600°).

The state of the target substrate 16 is monitored by observing distances from three points within a target irradiation area to a reference plane with the oblique ray alignment (off-axis alignment). Thereby, the flatness of the target substrate 16 can be maintained high. At this point, the distance in the height direction can be measured with an accuracy of less than 1 μm. As the result, the angle of the target substrate 16 can be measured with an accuracy of less than 0.03 degrees.

With a conventional ion implantation apparatus, since the size of an area which is irradiated with the ion beams 17 (target irradiation area) increases as the size of a target substrate increases, difficulties are involved in keeping the parallelism of the ion beams 17 high over the entire target irradiation area. In particular, trying to secure high parallelism of the ion beams over the entire surface of the target substrate results in increasing the size of the collimator magnet 13. However, since the collimator magnet 13 is inherently large in size, at present it is difficult to make the collimator magnet 13 so huge as to achieve high parallelism of ion beams over the entire surface of a target substrate. High parallelism can be achieved over the entire surface of a target irradiation area by limiting the target irradiation area to a square, 30 mm on a side, the size of a chip. Specifically, the parallelism can be controlled to within ±0.1 degrees.

Figure 5:
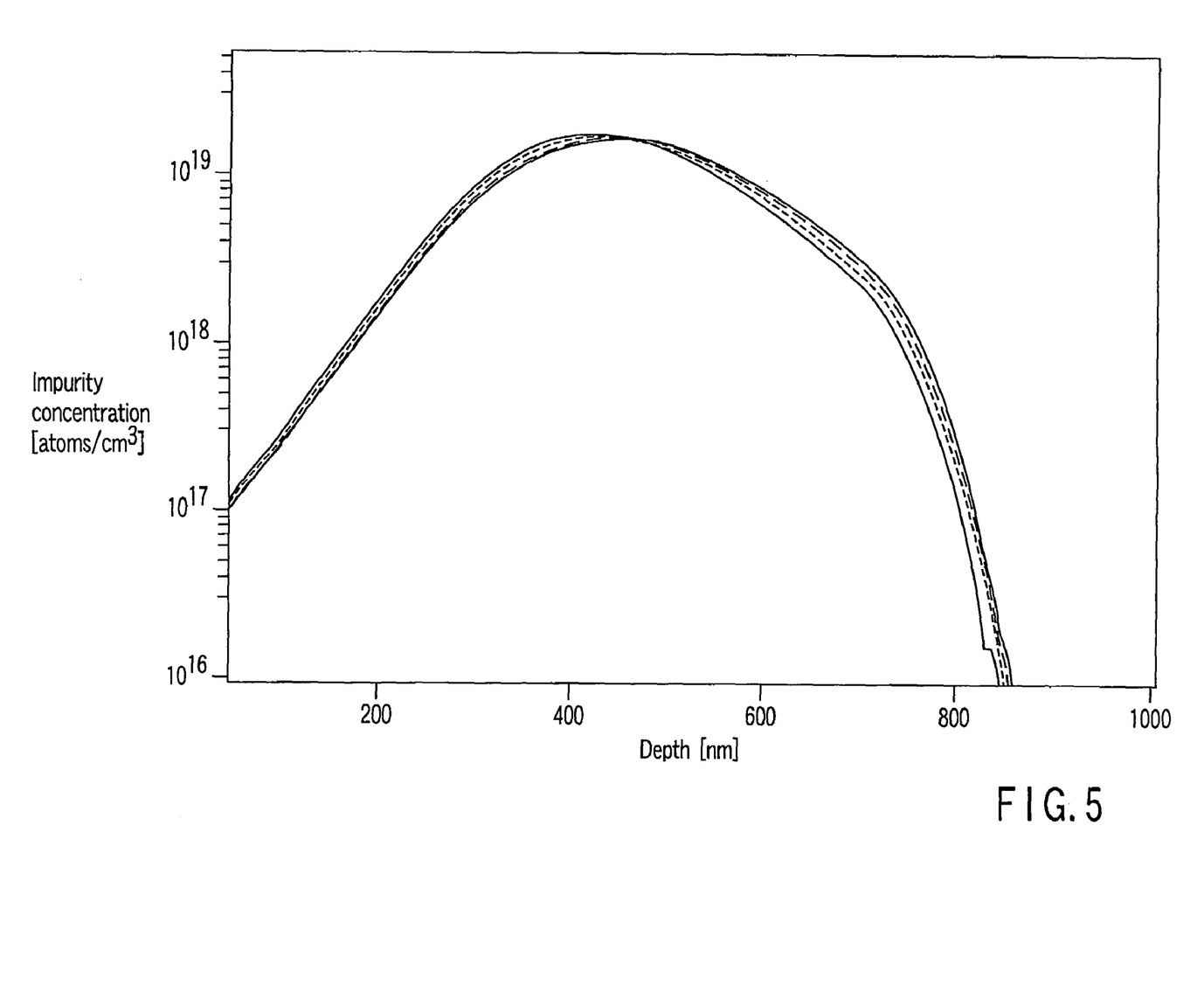
FIG. 5 shows profiles of impurities implanted by the ion implantation apparatus of the first embodiment.

The use of the ion implantation apparatus thus configured can achieve high parallelism with high accuracy. FIG. 5 shows impurity profiles obtained by the ion implantation apparatus of the first embodiment. These profiles indicate the results of implantation of ions of boron (B) accelerated at 100 keV with a parallelism of ±0.07 degrees into a substrate when the angle of implantation was changed in 0.1-degree steps. Note that ions are implanted into one target substrate at different incident angles in order to eliminate the effect of variations in profile resulting from variations in crystal cutout angle of target substrates.

The inventors tried to control the amount of channeling through the use of an ion implantation apparatus which is capable of controlling the incident angle and variations in incident angle with such a high accuracy as described above. More specifically, by controlling the amount of channeling, the inventors tried to control variations in impurity concentration due to the occurrence of channeling to within 1% as much as the uniformity and reproducibility of the amount of implanted impurity.

The threshold voltage of each transistor is one of the electrical characteristics of a semiconductor device. The threshold voltage of a transistor varies with the impurity concentration in its channel region. Although the rate of change of threshold voltage with respect to change of impurity concentration also varies with the structure and manufacturing process of transistors, the threshold voltage generally varies by about 1 mV when the impurity concentration varies by 1%.

Figure 6:
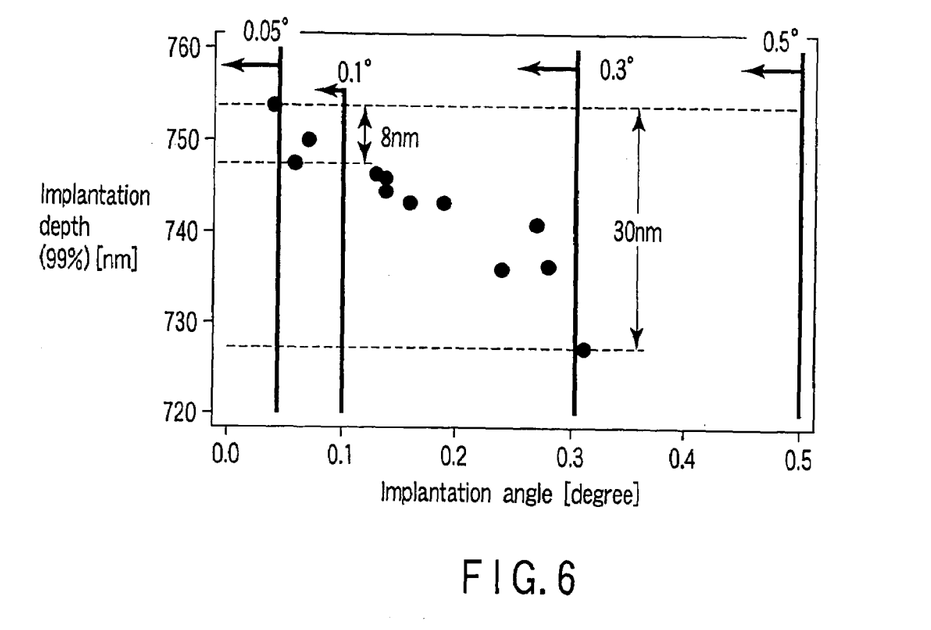
FIG. 6 shows a relationship between the parallelism of ion beams and the depth of implantation.

To study a way to reduce variations in impurity concentration below 1%, the inventors measured the depth of implantation when impurities were implanted at various angles under the same conditions (implanted ions, accelerating voltage, etc.). The measurements are illustrated in FIG. 6. FIG. 6 shows a relationship between the incident angle and the implantation depth. As shown, the implantation depth decreases as the incident angle increases irrespective of ion implantation under the same conditions. That is, it can be read that the implantation depth varies because the amount of channeling varies as the parallelism becomes poor. For example, with a parallelism of 0.3 degrees (variations in incident angle from about 0 (0.05) to 0.3 degrees), the implantation depth varies by about 30 nm at maximum. This variation of depth corresponds to a variation of the order of 3 to 5% in impurity concentration. These experimental results show that, when the parallelism is within the range of 0.1 degrees, the implantation depth varies by about 8 nm, which corresponds to a variation of about 1% in impurity concentration. In order to reduce variations in impurity concentration due to differences in the amount of channeling below 1%, therefore, controlling the parallelism to within ±0.1° was found to be desirable.

Figure 7:
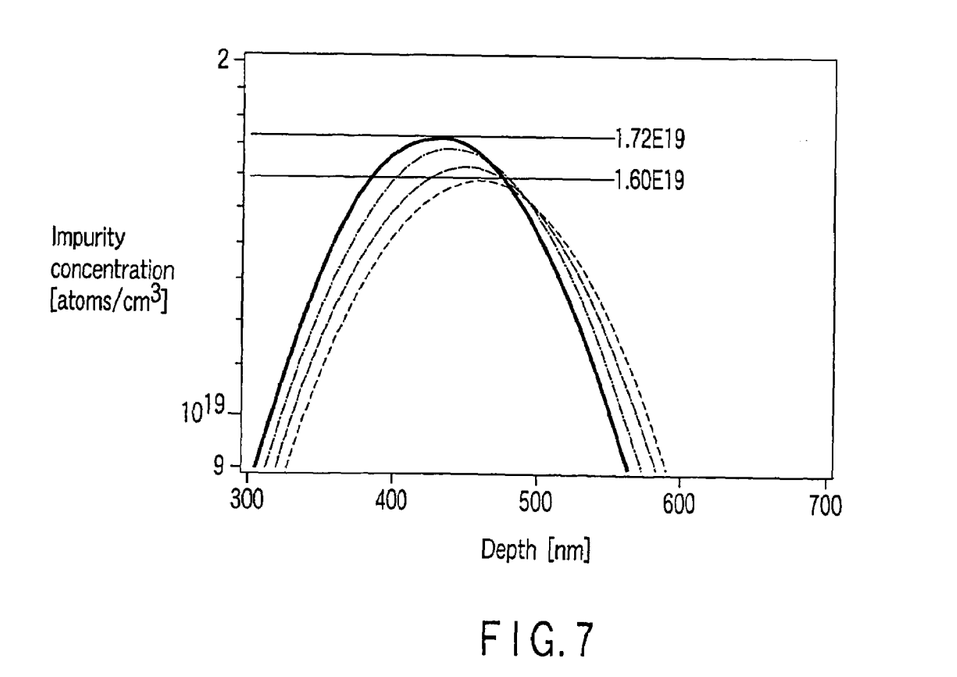
FIG. 7 shows impurity profiles when the incident angle is changed from 0 to ±0.35°.

Next, how the impurity profile changes with changing incident angle will be described. FIG. 7 shows impurity profiles when ions are implanted at four different angles from 0° (perpendicular to a target substrate) to 0.35°. From this diagram it can be seen that the impurity concentration profiles differ greatly from one another. In particular, the difference in concentration peak value between the profile having the maximum peak value ($=1.72\times10^{19}$) and the profile having the minimum peak value ($=1.60\times10^{19}$) exceeds 7%. This means that, when the parallelism is ±0.35 degrees, the peak value of the impurity profile can change in excess of 7%, depending on the implanted area.

Figure 8:
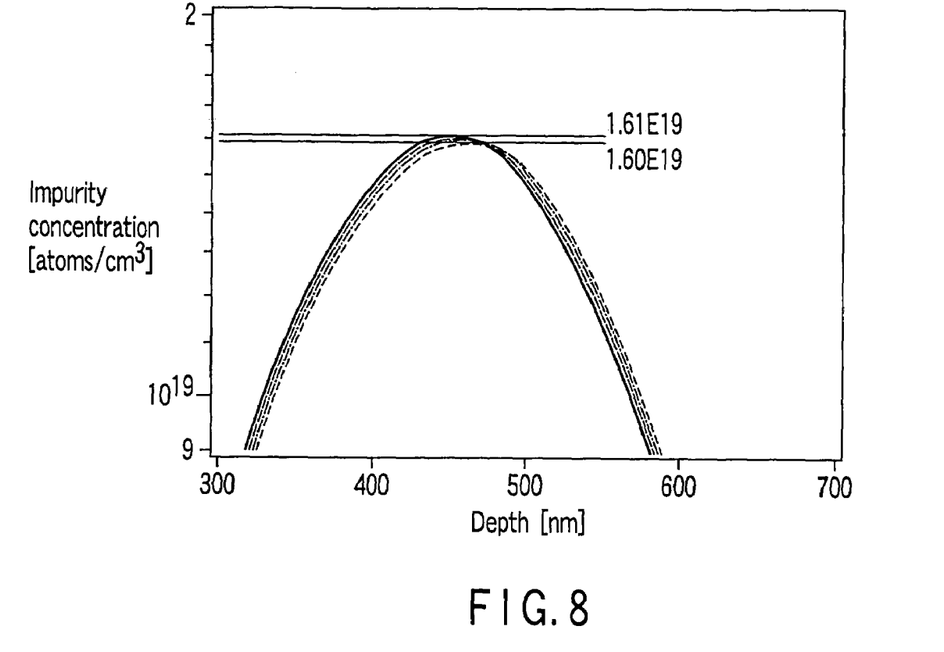
FIG. 8 shows impurity profiles when the incident angle is changed from 0 to ±0.13°.

FIG. 8 shows impurity profiles obtained when the angle of implantation was changed from 0 to 0.13 degrees. As shown, the impurity profiles are virtually the same even if the angle of implantation was changed to 0.13 degrees. The difference in peak value between the profile having the maximum peak value ($=1.61\times10^{19}$) and the profile having the minimum peak value ($=1.60\times10^{19}$) is less than 1%. Although, in FIG.

8, portions of the profiles near the peaks are shown enlarged, in their other portions as well, variations in impurity concentration are within 1%.

From FIGS. 6 and 8, it is shown that setting the parallelism to below 0.1 degrees allows variations in impurity concentration to be suppressed to below 1% irrespective of the occurrence of channeling.

Figure 9:
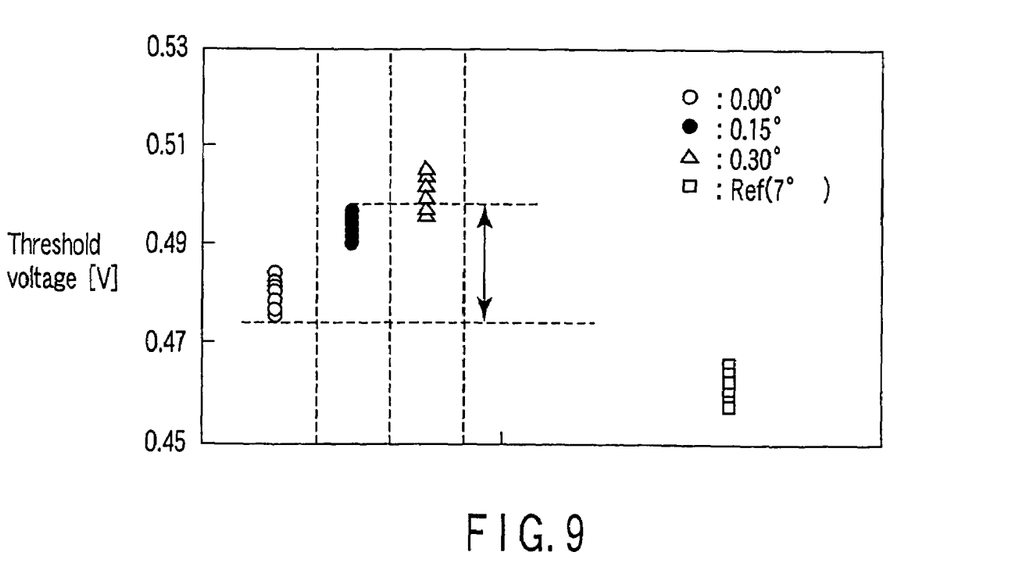
FIG. 9 shows variations in threshold voltage for each of different incident angles.

FIG. 9 shows a comparison between variations in threshold voltage when ions of boron (B$^+$) were implanted into the channel regions of transistors with the parallelism set to within ±0.07° using the present embodiment. FIG. 9 also shows variations in threshold voltage when ion implantation was carried out at an angle of 7 degrees using conventional techniques. In the present embodiment, ions were implanted at three incident angles of 0, 0.15, and 0.30 degrees. The variations in threshold voltage at each incident angle are attributed to process variations.

As shown in FIG. 9, when ions implanted with the parallelism set to within ±0.07°, variations in threshold voltage are comparable to those in the conventional 7-degree ion implantation. That is, since the amount of channeling is controlled by setting the parallelism to within ±0.07°, it is possible to achieve variations in electrical characteristics comparable to those in the case of ion implantation at an angle of 7 degrees the objective of which is to control variations in electrical characteristics due to the channeling.

When the angle of implantation is changed from 0° to 0.15° and 0.30°, the average threshold voltage increases by 15 mV and 22 mV, respectively. That is, when, using conventional techniques, ion implantation is carried out when the parallelism is ±0.15°, a variation of threshold voltage amounts to about 22 mV, which is the sum of about 7 mV due to process variations and a variation of 15 mV due to the incident angle. Likewise, when ion implantation is carried out when the parallelism is ±0.30°, a variation of threshold voltage amounts to about 30 mV as the result of a variation of 22 mV due to incident angle being added.

According to the ion implantation apparatus of the first embodiment of the present invention, ions are implanted into the target substrate 16 with the incident angle of the ion beams 17 controlled with high accuracy and the parallelism between the ion beams controlled to within ±0.1°. For this reason, the amount of channeling can be controlled well and the impurity profile of ions can be reproduced with high accuracy. More specifically, variations in impurity concentration can be suppressed to below 1%, allowing semiconductor devices with small variations in electrical characteristics to be mass-produced. In this case, the occurrence of shadowing and the increase of processing steps are avoided.

To heighten the parallelism of the ion beams 17, the inventors adopted making small a target irradiation area which is irradiated at a time with the ion beams as one method; however, other methods may be used to heighten the parallelism. For example, to heighten the parallelism use may be made of a low emittance ion source which produces ion beams. To hold the target substrate 16 with high flatness, other equipment than an electrostatic chuck in the substrate holder 16 may be used. The method of measuring the incident angle is not limited to the one described above. It is important that ions be implanted with variations in incident angle controlled to within ±0.1° through the use of apparatus capable of controlling the incident angle with high accuracy.

Note that the collimator magnet 13 (and the deflector 19) mainly controls the path of the ion beam 17 in the first embodiment as an example. However the ion beam generating unit 11 can be configured to control the path of the ion beam 17. In this case, the controller 18 outputs signal to control the ion beam irradiation unit 11 to the unit 11 as shown by broken arrows in FIGS. 1 and 2.

Figure 14:
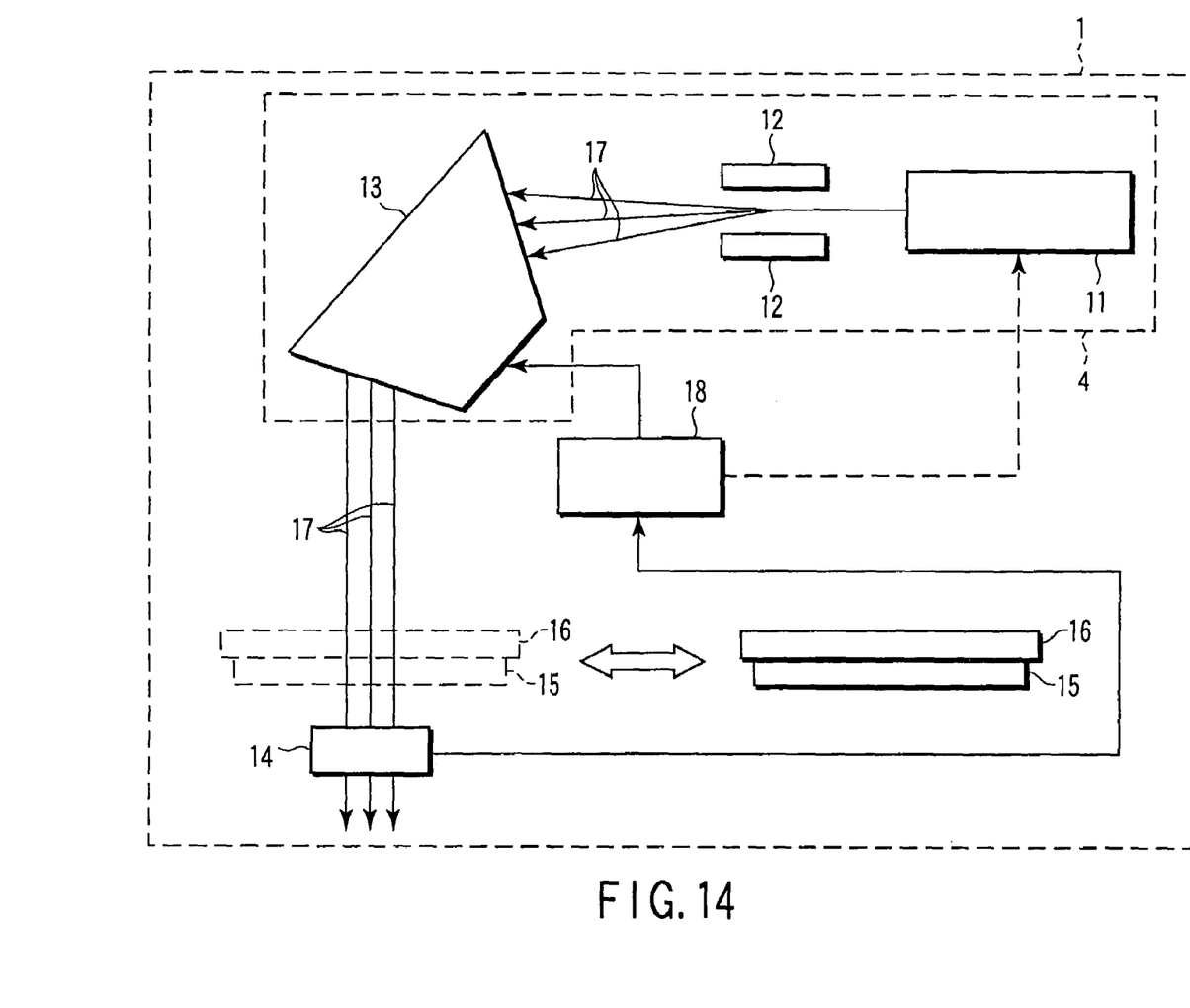
FIGS. 14 and 15 are schematic representations of the main portion of modified ion implantation apparatus according to the first embodiment.
Figure 15:
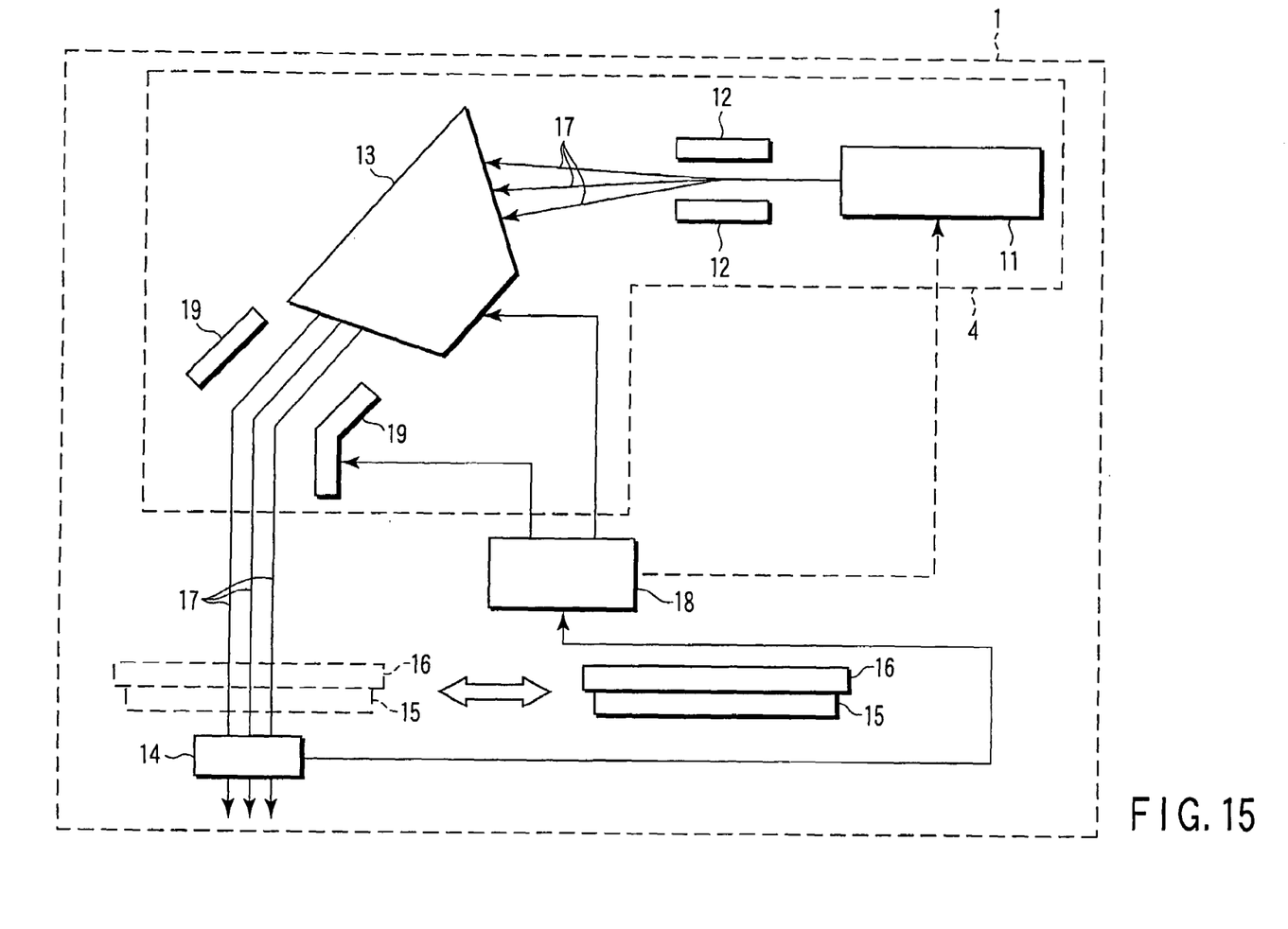

Further, the incident angle measuring instrument 14 is positioned between the ion irradiation unit 4 and the target substrate 16 in the first embodiment as an example. However as shown in FIGS. 14 and 15, the incident angle measuring unit 4 may be positioned at a backside of the target substrate 16. The target substrate 16 waits at a waiting position (shown by a solid line) when the incident angle and a parallelism of ion beams 17 are adjusted. The target substrate 16 is positioned between the incident angle measuring instrument 14 and the ion irradiation unit 4 during ion beam irradiation. Since the incident angle measuring unit 14 is fixed, the accuracy of measurement is enlarged and does not fluctuate. Since the ion beam does not need to pass through the incident angle measuring unit 14, the design of the incident angle measuring unit 14 is not strictly restricted.

Second Embodiment

In the second embodiment, in addition to the features of the first embodiment, control according to the crystal cutout angle of the target substrate 16 is performed.

In general, the crystal cutout angle is the same for all semiconductor substrates cut out in the same lot. However, since the cutout angle varies with lots, a variation of the order of 0.2 to 0.5° occurs from lot to lot. For this reason, the angle of implantation of ions into a semiconductor substrate varies from lot to lot. As the result, the impurity profile will vary from lot to lot. The second embodiment devised in consideration of such circumstances will be described below.

Figure 10:
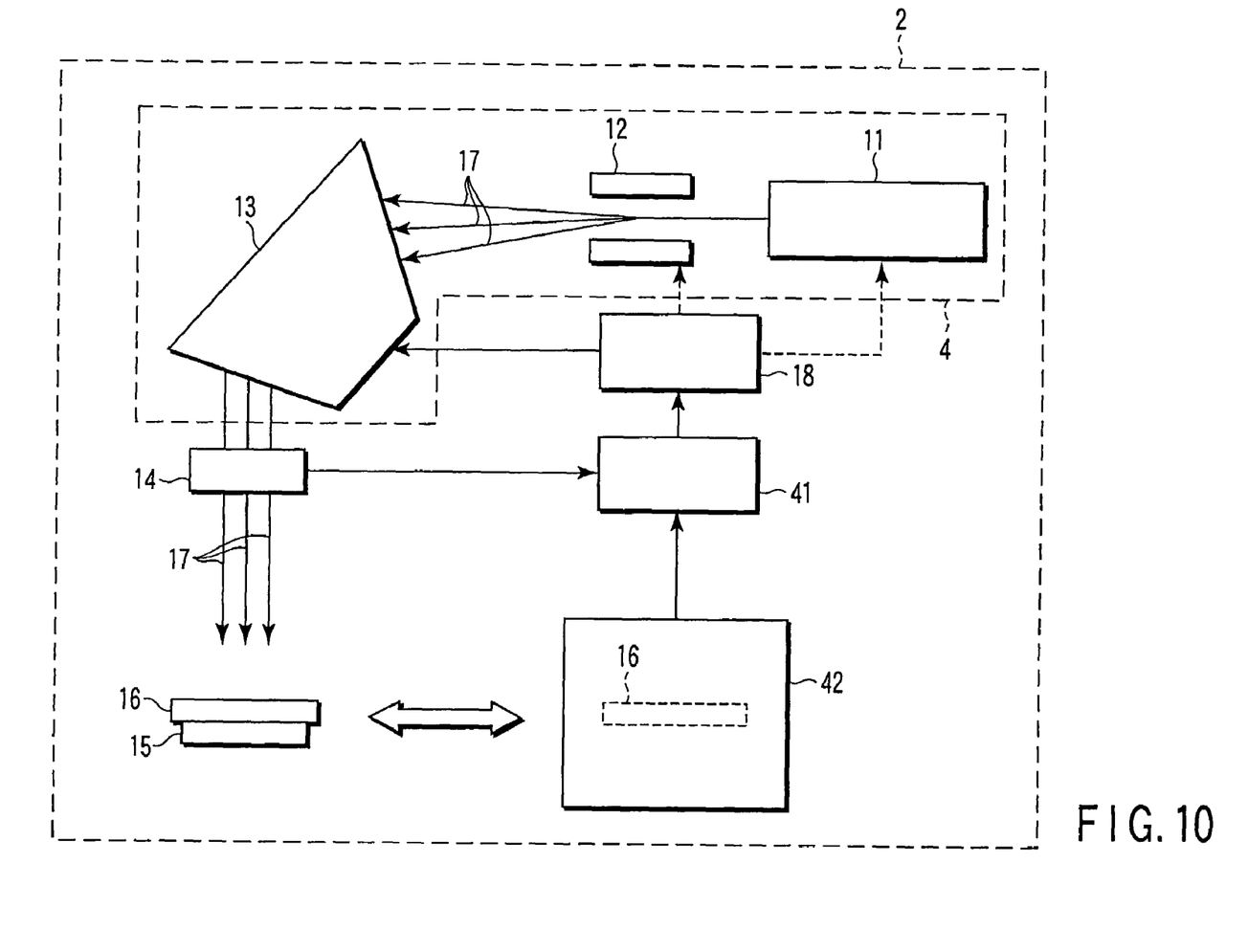
FIG. 10 is a schematic representation of the main portion of an ion implantation apparatus according to a second embodiment of the present invention.

FIG. 10 is a schematic representation of the main portion of an ion implantation apparatus according to the second embodiment of the present invention. As shown in FIG. 10, the ion implantation apparatus, indicated generally at 2, has an operation unit 41, which has the previously measured cutout angle of the target substrate 16 entered. The operation unit 41 is supplied with information concerning the incident angle of the ion beams 17 (the angle of implantation of ions into the substrate) measured by the incident angle measuring instrument 14. The computational results obtained by the operation unit 41 are fed into the controller 18.

Prior to ion implantation, the operation unit 41 calculates the difference between the values supplied from the incident angle measuring unit 14 and the cutout angle of the target substrate 16. The controller 18 then controls to change the paths of the ion beams 17 so that the calculated difference lies within a preset tolerance. Here, it is preferable that the tolerance of the angular difference be as near zero as possible because little error is preferable. However, this is not restrictive. To make finer adjustments, more time would be required to adjust the paths of the ion beams 17. For this reason, it is recommended that the tolerance be determined in consideration of the performance of the ion implantation apparatus 2 as to the parallelism of the ion beams 17 and the implantation reproducibility required in the ion implantation process. After the adjustments have been made, the target substrate 15 is actually irradiated with the ion beams 17. The parallelism of the ion beams at this point lies within ±0.1°.

The ion implantation apparatus 2 according to the second embodiment may be configured to have a cutout angle measuring instrument 42 that measures the cutout angle of the target substrate 16. In this case, prior to ion implantation process the cutout angle measuring instrument 42 automatically measures the cutout angle of the target substrate 16 and then sends the measurement to the operation unit 41. The subsequent processes are the same as above.

As a matter of course, the ion implantation apparatus 2 may be configured to have the ion irradiation unit 4 of FIG. 2. In this case, as in the first embodiment, the controller 18 controls the collimator magnet 13 and the deflector 19 so that the difference determined by the operation unit 41 is within the tolerance.

In the second embodiment, as in the first embodiment, ions are implanted into the target substrate 16 with parallelism within ±0.1° under the control of high precision. Thus, the second embodiment provides the same advantages as the first embodiment. In addition, according to the second embodiment, the paths of the ion beams 17 are adjusted so that the difference between the cutout angle of the target substrate 16 and the angle of implantation of the ion beams 17 lies within a given range. For this reason, it becomes possible to suppress variations in incident angle among target substrates 16 having different cutout angles because of different lots. Thus, semiconductor devices having little variations in electrical characteristics can be mass-produced irrespective of different cutout angles of semiconductor substrates 16.

Figure 16:
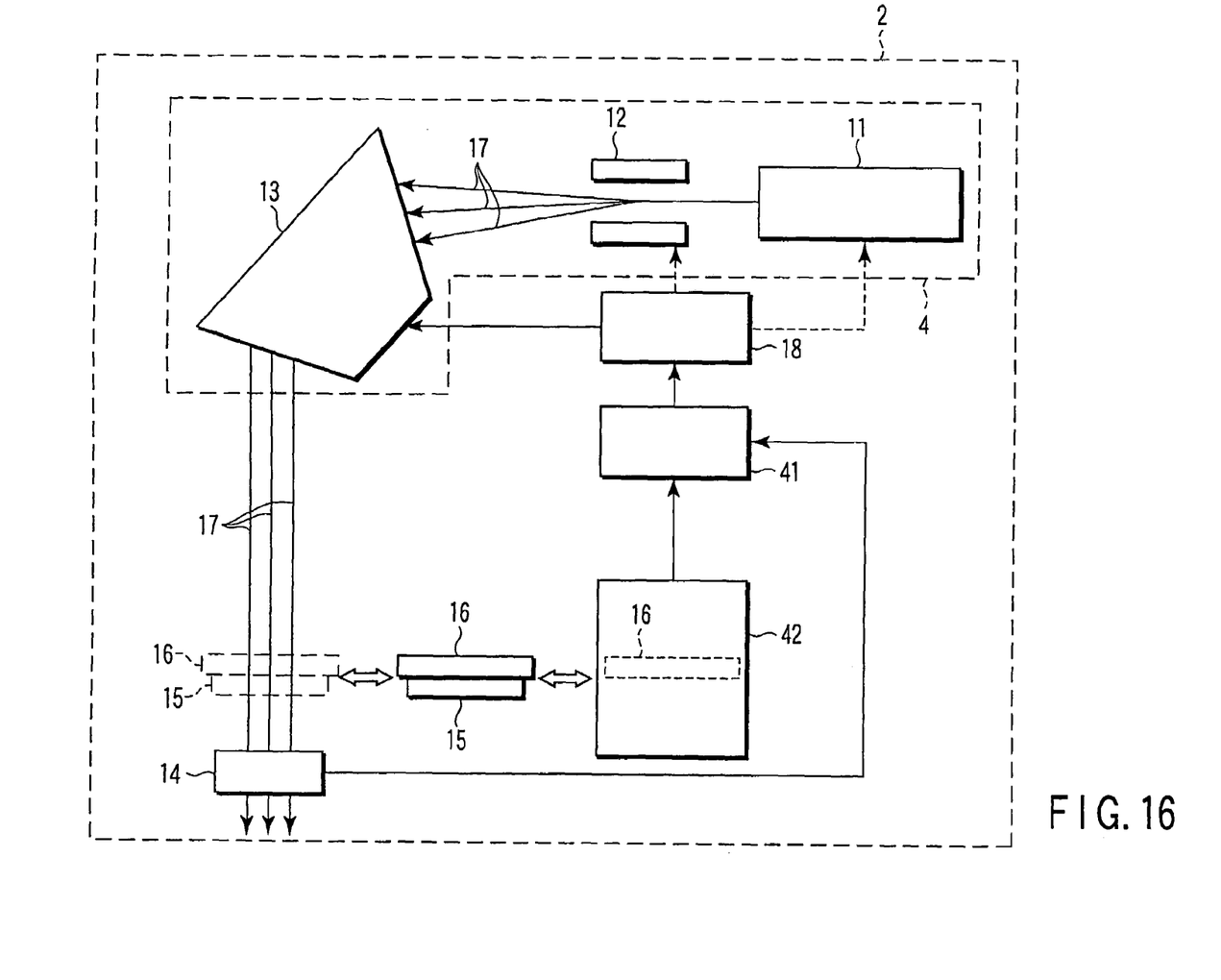
FIG. 16 is a schematic representations of the main portion of modified ion implantation apparatus according to the second embodiment.

As in the first embodiment, the ion beam irradiation unit 11 may be configured to control the path of the ion beam 17. In this case, the controller 18 outputs signal to control the ion beam generating unit 11 to the unit 11 as shown by broken arrows in FIG. 10. As described in the first embodiment with FIGS. 14 and 15, the incident angle measuring instrument 14 may be positioned backside of the target substrate 16 as shown in FIG. 16. This configuration also brings the same advantages as that depicted in the first embodiment.

Third Embodiment

The third embodiment is different from the second embodiment in the method to adjust the incident angle of the ion beams 17.

Figure 11:
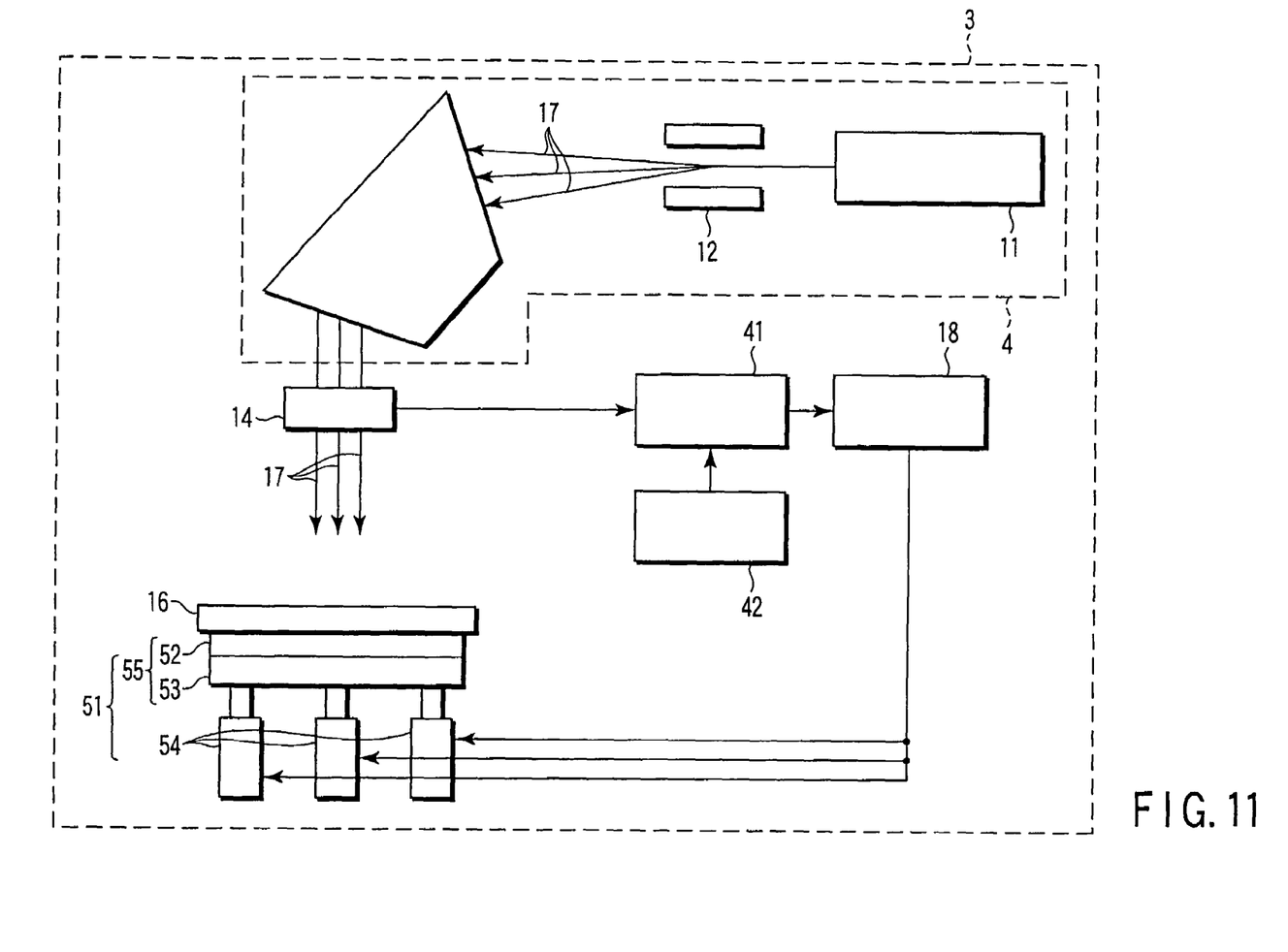
FIG. 11 is a schematic representation of the main portion of an ion implantation apparatus according to a third embodiment of the present invention.

FIG. 11 is a schematic representation of the main portion of an ion implantation apparatus, indicated generally by 3, according to the third embodiment of the present invention. As shown in FIG. 11, a substrate holder 51 consists of an electrostatic chuck 55 and three piezo actuators 54. The electrostatic chuck 55 is formed by insulating film 52 and a metal plate 53. The metal plate whose flatness is 1 μm or less is used to suppress the fluctuation of the held substrate 16 to 1 μm or less.

The controller 18 suitably controls the height of each of the piezo actuators 54 to change the inclination of the electrostatic chuck 55 (inclination of the target substrate 16). As with the first embodiment, the controller 18 is supplied with information concerning the difference between the incident angle of the ion beams obtained by the incident angle measuring instrument 14 and the cutout angle of the target substrate 16. The controller 18 controls the piezo actuators 54 so that the difference lies within a tolerance. As a result, the inclination of the target substrate 16 is finely adjusted so that the ions will be implanted into the target substrate 16 at the angle of implantation corresponding to the cutout angle of the substrate. After that, the target substrate 16 is actually irradiated with the ion beams 17. As in the case of the second embodiment, the information on the cutout angle of the target substrate 16 may be entered into the ion implantation apparatus 3 prior to the processing of the second embodiment or may be fed into the operation unit 41 from the cutout angle measuring instrument 42.

Figure 12:
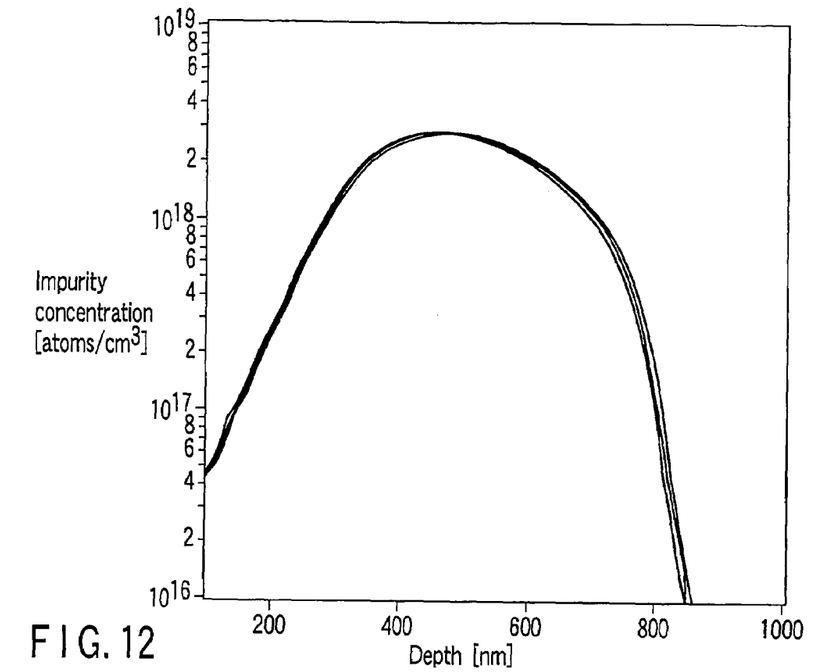
FIG. 12 shows the effectiveness of control by the substrate holder in the ion implantation apparatus of the third embodiment.

FIG. 12 shows the effectiveness of control of the ion implantation apparatus 3 configured as shown in FIG. 11, particularly of the substrate holder 51. More specifically, this diagram shows concentration profiles obtained when the angle of implantation of ions of boron accelerated at 100 keV was changed in 0.3-degree steps by changing the inclination of the electrostatic chuck 55 of the substrate holder 51. From FIG. 12 it is seen that the angle of implantation of ions is changed by changing the inclination of the electrostatic chuck 55 and as a result different concentration profiles are obtained.

Figure 13:
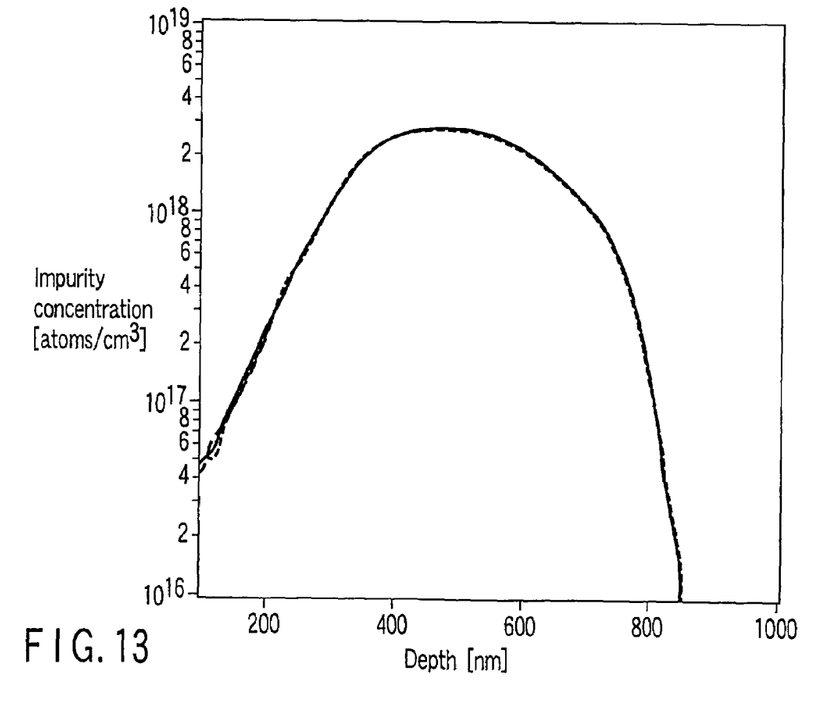
FIG. 13 shows profiles of ions implanted at the same angle by the ion implantation apparatus of the third embodiment.

FIG. 13 shows concentration profiles obtained when ion beams are irradiated three times by the ion implantation apparatus 3 shown in FIG. 11 with the incident angle controlled to a certain value. The parallelism of the ion beams 17 were controlled to within ±0.1° like the first embodiment. From FIG. 13 it is seen that substantially the same concentration profiles are obtained for different substrates, since variations in cutout angle among target substrates 16 are compensated for by changing the electrostatic chuck 55.

The ion implantation apparatus 3 of the third embodiment may be configured to have the ion irradiation unit 4 of FIG. 2.

In the ion implantation apparatus of the third embodiment, ions are implanted into the target substrate 16 with a parallelism of less than 0.1° under high precision control, as in the first embodiment. Thus, the third embodiment provides the same advantages as the first embodiment. In addition, in the third embodiment, the inclination of the target substrate 16 is adjusted so that the difference between the cutout angle of the substrate and the incident angle of the ion beams 17 lies within a given range. Therefore, the third embodiment allows semiconductor devices having little variations in electrical characteristics to be mass-produced irrespective of different cutout angles of semiconductor substrates, like the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ion implantation apparatus comprising:
an ion irradiation unit irradiating a plurality of areas of a target substrate with ion beams, each of the ion beams reaching the substrate at corresponding one incident angle;
an incident angle measuring instrument measuring the incident angle of each of the ion beams; and
a controller provided with information from the incident angle measuring instrument and controlling the ion irradiation unit in accordance with the information so that a difference among incident angles is set to within ±0.1°.

2. The ion implantation apparatus according to claim 1, wherein the incident measuring instrument is provided between the ion irradiation unit and the target substrate.

3. The ion implantation apparatus according to claim 1, wherein the incident measuring instrument is provided off the target substrate upon ion beam irradiation at a side opposite to the ion irradiation unit.

4. The ion implantation apparatus according to claim 1, wherein the controller controls the ion irradiation unit so that a difference between a cutout angle of the target substrate with respect to a crystal orientation of the target substrate and each of the incident angles lies within a preset range.

5. The ion implantation apparatus according to claim 1, further comprising a substrate holder holding the target substrate and changing an inclination of the substrate, thereby changing the incident angles.

6. The ion implantation apparatus according to claim 5, wherein the controller controls the substrate holder so that a difference between a cutout angle of the target substrate with respect to a crystal orientation of the target substrate and each of the incident angles lies within a preset range.

7. The ion implantation apparatus according to claim 1, further comprising a cutout angle measuring instrument measuring a cutout angle of the target substrate with respect to a crystal orientation of the target substrate and outputting the cutout angle to the controller.

8. The ion implantation apparatus according to claim 1, wherein the incident measuring instrument is provided between the ion irradiation unit and the target substrate.

9. The ion implantation apparatus according to claim 1, wherein the incident measuring instrument is provided off the target substrate upon ion beam irradiation at a side opposite to the ion irradiation unit.

10. The ion implantation apparatus according to claim 1, wherein the incident angle measuring instrument is configured to measure the incident angles to an accuracy of less than 0.1°.

11. The ion implantation apparatus according to claim 10, wherein the controller controls the ion irradiation unit so that a difference between a cutout angle of the target substrate with respect to a crystal orientation of the target substrate and each of the incident angles lies within a preset range.

12. The ion implantation apparatus according to claim 10, further comprising a substrate holder holding the target substrate and changing an inclination of the substrate, thereby changing the incident angles.

13. The ion implantation apparatus according to claim 12, wherein the controller controls the substrate holder so that a difference between a cutout angle of the target substrate with respect to a crystal orientation of the target substrate and each of the incident angles lies within a preset range.

14. The ion implantation apparatus according to claim 10, further comprising a cutout angle measuring instrument measuring a cutout angle of the target substrate with respect to a crystal orientation of the target substrate and outputting the cutout angle to the controller.

* * * * *